(12) United States Patent
Wang et al.

(10) Patent No.: US 8,865,482 B2
(45) Date of Patent: Oct. 21, 2014

(54) METHOD OF DETECTING THE CIRCULAR UNIFORMITY OF THE SEMICONDUCTOR CIRCULAR CONTACT HOLES

(71) Applicant: Shanghai Huali Microelectronics Corporation, Shanghai (CN)

(72) Inventors: Kai Wang, Shanghai (CN); HungLin Chen, Shanghai (CN); Yin Long, Shanghai (CN); Qiliang Ni, Shanghai (CN); MingShen Kuo, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 14/053,750

(22) Filed: Oct. 15, 2013

(65) Prior Publication Data

US 2014/0127835 A1    May 8, 2014

(30) Foreign Application Priority Data

Nov. 2, 2012    (CN) .......................... 2012 1 0432250

(51) Int. Cl.
*H01L 21/00* (2006.01)
*H01L 21/20* (2006.01)
*H01L 21/36* (2006.01)
*H01L 27/15* (2006.01)
*H01L 29/18* (2006.01)
*H01L 31/12* (2006.01)
*H01L 33/00* (2010.01)
*H01L 23/48* (2006.01)
*H01L 29/40* (2006.01)
*H01L 21/66* (2006.01)

(52) U.S. Cl.
CPC .............. *H01L 22/12* (2013.01); *Y10S 257/911* (2013.01); *Y10S 257/912* (2013.01)

USPC ............... 438/7; 438/487; 257/911; 257/912; 257/87; 257/276; 257/621; 257/E21.134; 257/E21.333

(58) Field of Classification Search
USPC ............... 438/7, 487; 257/E21.134, E21.333, 257/911, 912, 87, 276, 621
See application file for complete search history.

(56) References Cited

U.S. PATENT DOCUMENTS 3,783,228 A * 1/1974 Tarui et al. ................ 219/121.35
4,136,435 A * 1/1979 Li .................................... 438/22
(Continued)

FOREIGN PATENT DOCUMENTS

CN    102157496 A    8/2011
CN    102376601 A    3/2012

*Primary Examiner* — Evan Pert
*Assistant Examiner* — Gustavo Ramallo
(74) *Attorney, Agent, or Firm* — Renner, Otto, Boisselle & Sklar, LLP

(57) ABSTRACT

A method of detecting the circular uniformity of semiconductor circular contact holes. Several detection circuit structures are disposed on the semiconductor wafer: N-type active regions and P-type active regions; silicon dioxide layers separate the N-type active regions from the P-type active regions; the N-type active regions are formed in the P well and the P-type active regions are formed in the N well; polysilicon gates bridge the N-type active regions and the P-type active regions; gate oxide layers insulate the P-type regions and the N-type regions from the polysilicon gates, so that the P-type regions and the N-type regions are independent; the N-type active regions connect with circular contact holes while the P-type active regions and the polysilicon gates connect with oval contact holes; a electron beam scanner detects the circular uniformity of the contact holes. This invention advantageously reflects effectively and comprehensively the circular uniformity of the contact holes.

6 Claims, 2 Drawing Sheets

(56) References Cited

U.S. PATENT DOCUMENTS

| | | |
|---|---|---|
| 5,962,867 A * | 10/1999 | Liu .................................. 257/48 |
| 6,159,322 A * | 12/2000 | Ogata et al. .................... 156/230 |
| 7,105,436 B2 * | 9/2006 | Zhao et al. ..................... 438/637 |
| 2003/0104639 A1 * | 6/2003 | Kikuchi et al. ................... 438/7 |

\* cited by examiner

METHOD OF DETECTING THE CIRCULAR UNIFORMITY OF THE SEMICONDUCTOR CIRCULAR CONTACT HOLES

CROSS-REFERENCE TO RELATED APPLICATIONS

The present application claims priority under 35 U.S.C. §119 and the Paris Convention to Chinese application number CN 201210432250.3, filed on Nov. 2, 2012, the disclosure of which is herewith incorporated by reference in its entirety.

FIELD OF THE INVENTION

The present invention relates to the field of semiconductor fabrication, in particular it relates to a method of detecting the circular uniformity of semiconductor circular contact holes.

BACKGROUND OF THE INVENTION

With the development of semiconductor technology and the miniaturization in the feature size of device, the requirements on accuracy and stability during the production process are increasingly strict, even a deviation of a few nanometers can cause the yield loss. Especially, the feature sizes of polysilicon gates and circular contact holes are more sensitive. Circular uniformity is one of the technical parameters of the circular contact holes in the technical standard, its importance becomes higher and higher in the process whose feature size is 65 nanometers, even 45 nanometers and below.

During the process whose feature size is 45 nanometers and below, the accuracy problem of the feature size may indirectly cause that the semiconductor device performance deviates from the normal values, for example it might cause an electric leakage, etc. In some more serious situation, it can even result to the device failure, for example, short-circuit will be caused by the too small distance between contact holes. In the existing technology, the sampling method is applied to measure the circular uniformity of the circular contact holes. A certain percentage of contact holes are randomly selected in various locations of the wafer according to the shapes and sizes of the contact holes, and average values of the partial measurement are used to represent the overall measuring values of the circular uniformity of the contact holes on the wafer.

The measure method with partial elected points and random sampling usually causes sampling bias, thus it can not reflect the technical level of the contact holes comprehensively. Firstly, in the process of forming the contact holes, the influence due to the impurity during the exposure, etching and cleaning steps, which causes single or accidental substandard circular contact holes, can not be surely detected. The measured contact holes which are up-to-standard do not mean all the contact holes are up-to-standard. Secondly, in the regions where the contact holes are dense, since the distance between the contact holes is short, the requirements on the accuracy of the circular uniformity are relatively high. Therefore, the random sampling method cannot guarantee the weakest position in the art can be measured.

Chinese patent (CN102157496A) discloses a contact hole test device and a method for testing leakage current of grid by active area contact hole, wherein a plurality of parallel belt-shaped active areas are arranged in length direction; multi-line and two rows of active area contact holes are respectively generated at two sides of each active area; a first metal wire passing through the top end is connected to be an active area contact hole link from the first line and second row of the active area contact holes to the last line and last second row of the active area contact holes; grid electrodes with a length greater than the width of the active area are disposed on gate oxide surfaces on the active areas between two rows of active area contact holes; two ends of the grid electrode are respectively provided with grid electrode contact holes; a second metal wire passing through the top end is connected to be a grid electrode link from the first line and second row of the grid electrode contact holes to the last line and last second row of the grid electrode contact holes. The testing device and method can truly reflect the defects possibly occurring in the manufacturing procedure of MOSFET (metal-oxide-semiconductor field effect transistor) devices.

Chinese patent (CN102376601A) discloses a detection method and structure for deviation of a contact hole. The detection method comprises the following steps of: providing a wafer and at least forming two groups of detection graphs which are in parallel to a plane coordinate axis and are orthogonally arrayed on a semiconductor substrate in a detection region, wherein the detection graphs comprise first graphs and second graphs which are arranged at intervals along the array direction of the detection graphs, the conducting property of a first graph is different from that of a second graph; a first space is reserved between adjacent first graphs; carrying out a production process of the contact hole and respectively forming contact holes arranged along the direction of the coordinate axis on each detection graph and enabling a second space reserved between adjacent contact holes to be different from the first space; scanning the surface of the wafer by adopting an electron beam and acquiring the scanning brightness of the position of each contact hole on the surface of the wafer; and judging the partial deviation direction and the amplitude of the contact hole according to the scanning brightness of the position of each contact hole. According to the detection method and structure provided by the invention, the deviation direction and the amplitude of the contact hole on the wafer can be accurately detected.

SUMMARY OF THE INVENTION

According to the defects in the existing technologies, the present invention provides a method of detecting the circular uniformity of semiconductor circular contact holes, which includes:

a method of detecting the circular uniformity of semiconductor circular contact holes, wherein an electron beam scanner is applied to scan the circular contact holes on a semiconductor wafer; there is a substrate under the semiconductor wafer, the substrate connects to a low potential; wherein there are several detection circuit structures disposed on the semiconductor wafer; the way of disposing one of the detection circuit structures includes the following steps:

Step a, N-type active regions and P-type active regions are formed on the wafer;

Step b, a silicon dioxide layer is applied on the wafer to separate the N-type active regions from the P-type active regions; the N-type active regions are formed in a P well and the P-type active regions are formed in an N well;

Step c, polysilicon gates are used to bridging the N-type active regions and the P-type active regions; gate oxide layers are disposed between the P-type active is regions and the N-type active regions to insulate the P-type regions and the N-type regions from the polysilicon gates, so that the P-type regions and the N-type regions are independent;

Step d, the N-type active regions connect with circular contact holes, both the P-type active regions and the polysilicon gates connect with oval contact holes;

Step e, the electron beam scanner is used to detecting the circular uniformity of semiconductor circular contact holes.

It is preferred according to the above method that the detection circuit structures are in the form of arrays repeatedly arranged on the semiconductor wafer.

It is preferred according to the above method when the circular uniformity of the circular contact holes are up to standard, the N-type active regions and the P well are formed as a PN junction; the PN junction is in the reverse blocking state so that the positive charge on the surface of the semiconductor wafer cannot connect to the low potential through the substrate; the positive charge piled up on the surface of the semiconductor wafer attracts electron reflection so that the electron beam scanner collects fewer secondary electrons, thus the circular contact holes are darker.

It is preferred according to the above method when the circular uniformity of the circular contact holes are up to standard, the P-type active regions and the N well are formed as a PN junction; the forward conductive PN junction enables the positive charge on the surface of the semiconductor wafer to connect to the low potential through the substrate; the electron beam scanner collects more secondary electrons so that the oval contact holes are brighter.

It is preferred according to the above method when the circular uniformity of the circular contact holes are not up to the standard, the circular contact holes and the polysilicon gates are in short-circuit state, thus the electrons piled up on the surface of the semiconductor wafer connect to the P-type active regions by the polysilicon gates and the oval contact holes, which cause the reduction of the electrons and make the circular contact holes become brighter.

It is preferred according to the above method that a calculating device is set in the electron beam scanner; the calculating device calculates the number of the circular contact holes whose circular uniformity are not qualified after the electron beam scanner scans the detection circuit structures on the semiconductor wafer respectively, and the result is displayed in the form of percentage.

The advantages of the present invention are: the circular uniformity of the contact holes are reflected effectively and comprehensively, the development of the advanced process for the contact holes whose feature size are 45 nm and below is supported, and the development cycle is shorten.

DETAILED DESCRIPTION OF THE PREFERRED EMBODIMENT

The present invention will be further illustrated as follows in combination with the figures and the embodiments, but these contents should not be deemed as the limitation of this invention.

Figure 1:
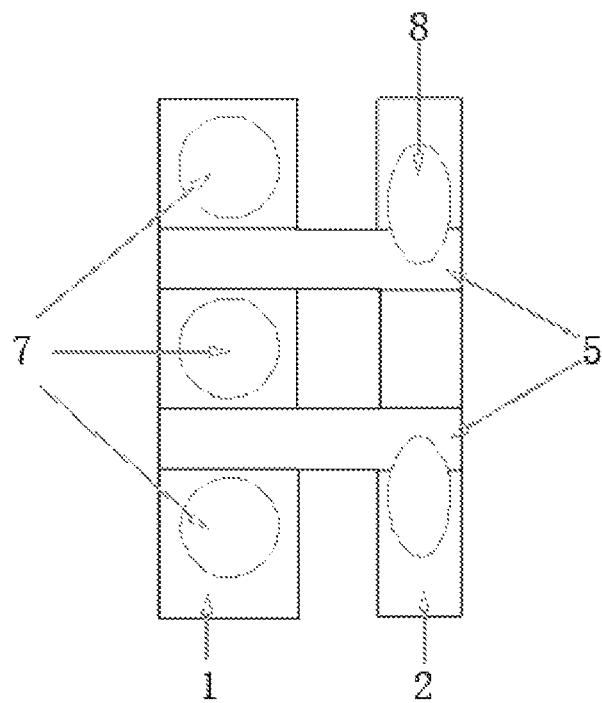
FIG. 1 is a structure diagram of a detection circuit structure in accordance with an embodiment of the present invention.
Figure 2:
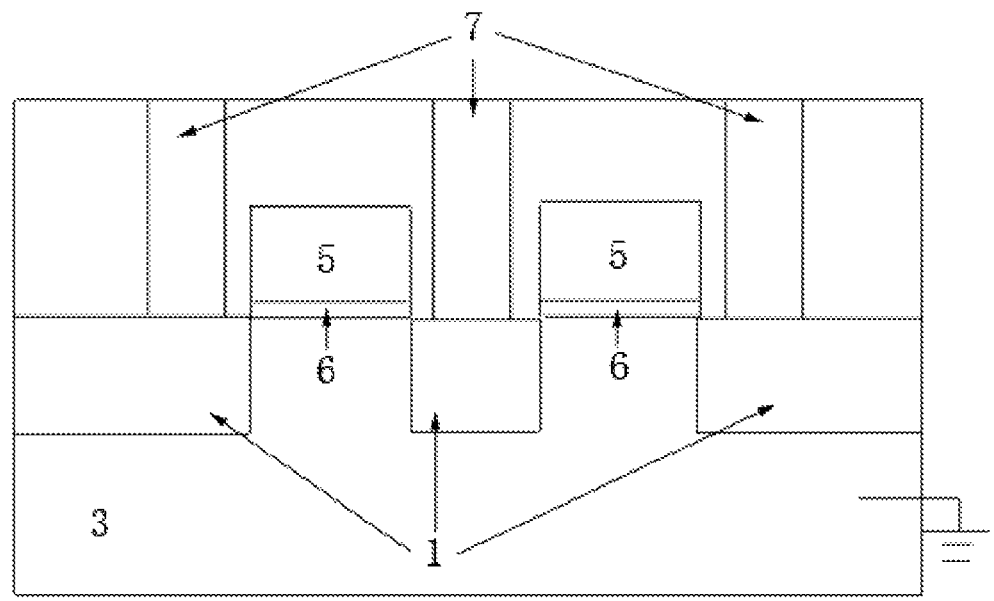
FIG. 2 is a sectional view of an N-type active region in accordance with the embodiment of the present invention.
Figure 3:
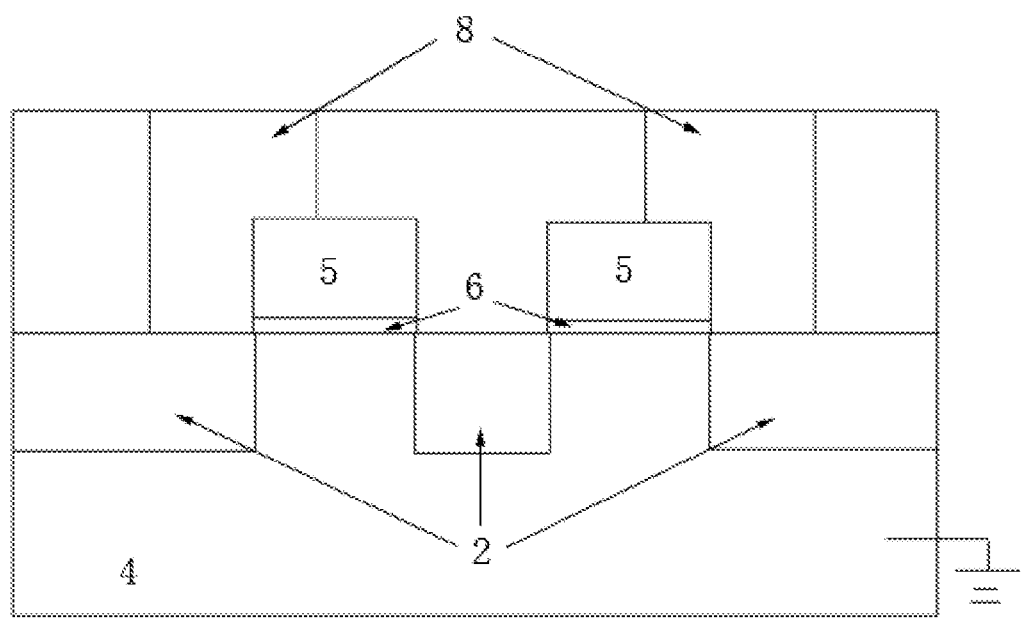
FIG. 3 is a sectional view of a P-type active region in accordance with the embodiment of the present invention.

As shown in FIG. 1, it is a detection circuit structure which is applied in detecting and checking the circular uniformity of the semiconductor circular contact holes in the embodiment of the present invention. The detection circuit structure includes an N-type active region 1 and a P-type active region 2 which are separated by a silicon dioxide layer, wherein the N-type active region 1 is in a P well 3 (as shown in FIG. 2) and the P-type active region 2 is in an N well 4 (as shown in FIG. 3). A polysilicon gate 5 bridges the N-type active region and the P-type active region, gate oxide layers are disposed between the P-type active regions and the N-type active regions to insulate the P-type regions and the N-type regions from the polysilicon gates (as shown in FIGS. 2 and 3) so that the P-type regions and the N-type regions are independent. Then two kinds of contact holes are formed by exposure process: A type contact holes 7 are circular-shaped while B type contact holes 8 are oval-shaped. The circular contact holes are connected to the N-type active region and the oval contact holes are connected to the P-type active region and the polysilicon gate, thus the connection of a detection circuit structure is formed. The minimum feature size of corresponding to the process is chosen for this structure, and the mentioned structures are disposed on a wafer by forms of repeated arrays according to the density of the patterns to form a region for testing, thus the region can be scanned by the electron beam scanner. The electron beam scanner scans the testing regions and compares all the circular contact holes in the testing regions in sequence so as to locate the circular contact holes which are shorten.

In the situation that the circular uniformity of the circular contact holes conforms with the standard, according to the principle of electron beam scan, when the positive charge distribution appears on the surface of the semiconductor wafer, the positive charge on the wafer cannot connect to the low potential through the substrate as the PN junction formed by the N-type active regions and the P well is in the reverse blocking state. The positive charges piled up on the surface of the wafer attract the electrons reflection, resulting that the electron beam scanner collects fewer secondary electrons, thus the circular contact holes are darker. However, the PN junction formed by the P-type active regions and the N well is in forward conductive state, the positive charges on the surface of the wafer connect to the low potential through the substrate. Therefore, it is impossible to pile up more positive charges to attract electron reflection thus the electron beam scanner will collect more secondary electrons so that the oval contact holes are brighter.

The distance between the circular contact holes and the polysilicon gate is small, when the circular uniformity of circular contact holes even deviates slightly, the circular contact holes and the polysilicon gate will in short-circuit. As the polysilicon gates are connected to the P-type active regions through the oval contact holes, the amount of the electrons piled up on the surface of the circular contact holes reduces due to the connection of the polysilicon gates, the oval contact holes and the P-type active regions. As a result, the circular contact holes become brighter. Through the comparison with the circular contact holes without short-circuit, it can easily find the circular contact holes whose circular uniformity does not meet the requirement. The electron beam scanner includes a calculating device. The calculating device calculates the number of the circular contact holes which are short-circuit according to the scanning results and quantifies the qualification rate of the circular uniformity of contact holes in the form of percentage.

For example, in order to check if the circular uniformity of the contact holes is exact or not in the product whose feature size is 45 nm and below, the feature sizes of the contact holes and the polysilicon gate are defined as 45 nm and below, and the detection circuit structures are arranged in the form of repeated arrays with different distances. Each array has 1000 contact holes. The contact holes are scanned in sequence by the electro beam. The contact holes are compared to achieve the precision of the circular uniformity of the contact holes with different feature sizes and with different density of the patterns. And the qualification rate of the circular uniformity of contact holes is quantitatively evaluated in the form of percentage.

Through the above mentioned method the problem of insufficient sampling under the condition of the existing circular uniformity measuring method can be overcome. At the same time the qualification rate under different densities of the pattern in the same process is achieved and the development cycle is reduced.

Although the invention has been described in connection with one particular embodiment, but it is not to limit the implement method and the scope of protection of the invention. It is appreciated that all the obvious and equal varieties for the skilled in the art which are based on the descriptions and the drawings of the present invention should be included in the scope of protection of this invention.

The invention claimed is:

1. A method of detecting the circular uniformity of semiconductor circular contact holes, wherein an electron beam scanner is applied to scan the circular contact holes on a semiconductor wafer; there is substrate under the semiconductor wafer, the substrate connects to a low potential; wherein there are several detection circuit structures disposed on the semiconductor wafer; the way of disposing one of the detection circuit structures includes the following steps:

Step a, N-type active regions and P-type active regions are formed on the wafer;

Step b, a silicon dioxide layer is applied on the wafer to separate the N-type active regions from the P-type active regions; the N-type active regions are formed in a P well and the P-type active regions are formed in an N well;

Step c, polysilicon gates are used to bridge the N-type active regions and the P-type active regions; gate oxide layers are disposed between the P-type active regions and the N-type active regions to insulate the P-type regions and the N-type regions from the polysilicon gates, so that the P-type regions and the N-type regions are independent;

Step d, the N-type active regions connect with circular contact holes, both the P-type active regions and the polysilicon gates connect with oval contact holes;

Step e, the electron beam scanner is used to detect the circular uniformity of semiconductor circular contact holes.

2. The method according to claim 1, wherein the detection circuit structures are repeatedly arranged in the form of arrays on the semiconductor wafer.

3. The method according to claim 1, wherein when the circular uniformity of the circular contact holes are up to standard, the N-type active regions and the P well are formed as a PN junction; the PN junction is in the reverse blocking state so that the positive charge on the surface of the semiconductor wafer cannot connect to the low potential through the substrate; the positive charge piled up on the semiconductor wafer attracts electron reflection so that the electron beam scanner collects fewer secondary electrons, thus the circular contact holes are darker.

4. The method according to claim 3, wherein, when the circular uniformity of the circular contact holes are up to standard, the P-type active regions and the N well are formed as the PN junction; the forward conductive PN junction enables the positive charge on the surface of the semiconductor wafer to connect to the low potential through the substrate, the electron beam scanner collects more secondary electrons so that the oval contact holes are brighter.

5. The method according to claim 1, wherein, when the circular uniformity of the circular contact holes are not up to the standard, the circular contact holes and the polysilicon gates are in short-circuit state, thus the electrons piled up on the surface of the semiconductor wafer connect to the P-type active regions by the polysilicon gates and the oval contact holes which cause the reduction of the electrons and make the circular contact holes become brighter.

6. The method according to claim 1, wherein a calculating device is set in the electron beam scanner; the calculating device calculates the number of the circular contact holes whose circular uniformity are not qualified after the electron beam scanner scans the detection circuit structures on the semiconductor wafer respectively, and the result is displayed in the form of percentage.

* * * * *